(12) United States Patent
Pilkington et al.

(10) Patent No.: US 12,507,519 B2
(45) Date of Patent: Dec. 23, 2025

(54) MONOLITHIC RGB MICRO LED DISPLAY

(71) Applicant: PLESSEY SEMICONDUCTORS LTD, Plymouth (GB)

(72) Inventors: James Pilkington, Plymouth (GB); Samir Mezouari, Plymouth (GB); Weisin Tan, Plymouth (GB); John Whiteman, Plymouth (GB); Keith Strickland, Plymouth (GB)

(73) Assignee: Plessey Semiconductors Ltd, Plymouth (GB)

( * ) Notice: Subject to any disclaimer, the term of this patent is extended or adjusted under 35 U.S.C. 154(b) by 433 days.

(21) Appl. No.: 17/916,581

(22) PCT Filed: May 12, 2021

(86) PCT No.: PCT/GB2021/051137
§ 371 (c)(1),
(2) Date: Oct. 2, 2022

(87) PCT Pub. No.: WO2021/234346
PCT Pub. Date: Nov. 25, 2021

(65) Prior Publication Data
US 2023/0154967 A1 May 18, 2023

(30) Foreign Application Priority Data
May 19, 2020 (GB) .................... 2007395

(51) Int. Cl.
*H10H 29/14* (2025.01)
(52) U.S. Cl.
CPC .................. *H10H 29/142* (2025.01)

(58) Field of Classification Search
CPC ............... H10H 29/142; H10H 20/034; H10H 20/0361; H10H 20/0363; H10H 20/8512;
(Continued)

(56) References Cited

U.S. PATENT DOCUMENTS

2017/0117444 A1* 4/2017 Stoll ...................... H10K 50/86
2019/0302917 A1 10/2019 Pan
(Continued)

FOREIGN PATENT DOCUMENTS

CN 110911459 A 3/2020
EP 3561368 A1 10/2019
(Continued)

OTHER PUBLICATIONS

Kanibolotsky AL, Laurand N, Dawson MD, Turnbull GA, Samuel IDW, Skabara PJ. Design of Linear and Star-Shaped Macromolecular Organic Semiconductors for Photonic Applications. Acc Chem Res. Jun. 18, 2019;52(6):1665-1674. doi: 10.1021/acs.accounts. 9b00129. Epub May 22, 2019. PMID: 31117341. (Year: 2019).*
(Continued)

*Primary Examiner* — Jonathan Han
(74) *Attorney, Agent, or Firm* — Cognition IP, P.C.; Edward Steakley (57) ABSTRACT

A method of forming a light emitting diode array comprising a plurality of light emitting pixels, wherein at least one of the light emitting pixels comprises: a light emitting diode configured to emit light of a first primary peak wavelength; and organic semiconductors dispersed in a medium, wherein the organic semiconductors are configured to receive and convert input light of the first primary peak wavelength from the light emitting diode to provide output light of a second primary peak wavelength.

18 Claims, 7 Drawing Sheets

(58) Field of Classification Search
CPC .. H10H 20/84; H10H 20/841; H10H 20/8513; H10H 20/855; H10H 20/856; H10H 29/10; H10H 20/0362; H10H 20/854; H01L 25/0753
See application file for complete search history.

(56) References Cited

U.S. PATENT DOCUMENTS

| | | | |
|---|---|---|---|
| 2019/0326349 A1 | 10/2019 | Kwon et al. | |
| 2020/0075816 A1 | 3/2020 | Cheng et al. | |
| 2020/0144458 A1* | 5/2020 | Lee | H10H 20/825 |
| 2020/0152694 A1 | 5/2020 | Lee et al. | |
| 2022/0102583 A1* | 3/2022 | Baumheinrich | G02B 6/105 |

FOREIGN PATENT DOCUMENTS

| | | |
|---|---|---|
| JP | 2013065726 A | 4/2013 |
| JP | 2019153783 A | 9/2019 |
| KR | 20180099996 A | 9/2018 |
| KR | 20190072965 A | 6/2019 |
| WO | 2019147589 A1 | 8/2019 |
| WO | 2020054575 A1 | 3/2020 |

OTHER PUBLICATIONS

Patents Act 1977: Examination Report Under Section 18(3) in GB application No. GB2007395.3, mailed Feb. 7, 2023.
International Search Report and Written Opinion in PCT International Application No. PCT/GB2021/051137 mailed Aug. 18, 2021.
Second Examination Report for GB Application No. 2007395.3, dated Jul. 5, 2022.
Combined Search and Examination Report for GB Application No. 2007395.3, dated Oct. 27, 2020.
Kanibolotsky, Alexander L. et al; "Design of Linear and Star-Shaped Macromolecular Organic Semiconductors for Photonic Appliactions", Accounts of Chemical Research, vol. 52, No. 6; Jun. 18, 2019; pp. 1665-4842.
Taylor-Shaw, Elaine et al., "Cool to Warm White Light Emission from Hybrid Inorganic/Organic Light-Emitting Diodes", Journal of Materials Chemistry, vol. 4, No. 48; Jan. 1, 2016, pp. 11499-11507.

* cited by examiner

MONOLITHIC RGB MICRO LED DISPLAY

CROSS-REFERENCE TO RELATED APPLICATIONS

This application is a 35 U.S.C. § 371 national stage application of PCT International Application No. PCT/GB2021/051137, filed on May 12, 2021, which claims the benefit of Great Britain Application No. 2007395.3, filed May 19, 2020, which are hereby incorporated by reference in their entirety.

FIELD OF THE INVENTION

The invention relates to an array of micro light emitting diodes (LEDs) and a method for forming an array of LEDs. In particular, but not exclusively, the invention relates to a multicolour monolithic array of light emitting diodes using down converting organic semiconductors and a method for forming a multicolour monolithic array of light emitting diodes using down converting organic semiconductors.

BACKGROUND OF THE INVENTION

It is known that light emitting diode (LED) devices provide efficient sources of light for a wide range of applications. Increases in LED light generation efficiency and extraction, along with the production of smaller LEDs (with smaller light emitting surface areas) and the integration of different wavelength LED emitters into arrays, has resulted in the provision of high quality colour arrays with multiple applications, in particular in display technologies.

In order to provide high resolution LED arrays, such as micro LED arrays, the light emitting surface area defining the pixel surface is reduced compared with the light emitting surface of conventional LEDs, as is the pixel pitch. However, as the pixel pitch in such arrays is reduced to very small pitches (e.g., less than 5 µm) in order to provide higher resolution arrays, a number of difficulties arise. For example, quantum dots (QDs) are typically used as colour conversion layers to achieve a full colour red green blue (RGB) display, where blue LEDs are typically used as the source of input light. Such QDs are typically used to convert blue input light to red light and green light using appropriate QDs. However, such QD layers are generally required to be of the order of 20 µm to 30 µm thick in order to achieve full colour saturation. Therefore, at these thicknesses, the minimum pixel that can be produced is restricted to a width of above 20 µm.

Further difficulties are known to arise in processing QDs for light wavelength colour conversion in micro LED arrays, such as degradation in efficiency and lifetime of the wavelength converting QDs when forming layers of material comprising QDs using photolithography and inkjet printing, for example. Accordingly, there are significant challenges in the pursuit of high resolution micro LED arrays, for which it would be beneficial to have a pixel pitch is less than 10 µm.

SUMMARY OF THE INVENTION

In order to mitigate for at least some of the above described problems, there is provided a light emitting diode array comprising a plurality of light emitting pixels and a method of forming a light emitting diode array comprising a plurality of light emitting pixels in accordance with the appended claims.

In an example, there is provided method of forming a light emitting diode array comprising a plurality of light emitting pixels, wherein at least one of the light emitting pixels comprises: a light emitting diode configured to emit light of a first primary peak wavelength; and organic semiconductors dispersed in a medium, wherein the organic semiconductors are configured to receive and convert input light of the first primary peak wavelength from the light emitting diode to provide output light of a second primary peak wavelength.

There is also provided a light emitting diode array comprising a plurality of light emitting pixels, wherein at least one of the light emitting pixels comprises: a light emitting diode configured to emit light of a first primary peak wavelength; and organic semiconductor dispersed in a medium, wherein the organic semiconductors are configured to receive and convert input light of the first primary peak wavelength from the light emitting diode to provide output light of a second primary peak wavelength.

Advantageously, the combination of a light emitting diode array with organic semiconductors dispersed in a medium means that a desired colour of light is provided that is different from the colour of light produced by the light emitting diode array. Beneficially, the use of organic semiconductors dispersed in a medium means that very thin films, typically of the order of 1 µm to 2 µm are used to convert the primary peak wavelength of light from a first wavelength to a second wavelength in an efficient manner. This means that very thin films of colour converting organic semiconductors dispersed in a medium are used for high efficiency colour conversion with reduced absorption compared to known methods. Further, the efficiency of absorption and subsequent emission of light from organic semiconductors means that there is no requirement for an additional blue light blocking filter, which may otherwise be required where highly efficient blue light emitting LEDs are used to provide an optical pump source for colour conversion layers and where the blue light is not fully absorbed. Accordingly, the combination of organic semiconductors with a light emitting diode array provides excellent colour saturation performance.

Preferably, at least one further light emitting pixel comprises: a further light emitting diode configured to emit light of the first primary peak wavelength; and further organic semiconductors dispersed in a further medium, wherein the further organic semiconductors are configured to receive and convert input light of the first primary peak wavelength from the further light emitting diode to output light of a third primary peak wavelength.

Advantageously, the ability to control the absorption and emission properties of organic semiconductors means that the light emitting pixels with different wavelengths of light emission are provided using a light emitting diode array that uses light emitting diodes that emit the same wavelength of light (such as blue LEDs pumping both green and red colour conversion layers and producing RGB emission when combined with blue emission from the LEDs in the light emitting diode array).

Preferably, the method comprises depositing the medium and/or the further medium on a light emitting diode array, preferably wherein depositing the medium and/or further medium comprises slit coating or spin coating the medium and/or further medium.

Advantageously, the organic semiconductors are tunable for full dissolution in different media. This means that they are deposited using techniques such as slit coating or spin coating and are therefore not subject to photolithographical methods or inkjet printing, which are known to result in degradation for quantum dots that are dispersed in photo definable material, for example.

Preferably, the method comprises selectively covering one or more light emitting diodes in the light emitting diode array with a material prior to depositing the medium and/or the further medium, thereby to enable selective deposition of the medium and/or further medium.

Advantageously, an efficient method for the self-alignment of organic semiconductor material is provided, which enables the formation of light emitting pixels that emit light of different wavelengths based on the same wavelength of input light provided by the array of light emitting diodes.

Preferably, the material is at least one of: a temporary material that is removable thereby to enable further deposition of the medium and/or the further medium on the selectively covered one or more light emitting diodes in a further distinct step after deposition of the medium and/or further medium on the light emitting diode array; and an optically transparent material that enables light emission from the selectively covered one or more light emitting diodes, wherein the one or more light emitting diodes are configured to emit light with the primary peak wavelength.

Advantageously, the use of temporary material enables sequential deposition steps for the deposition of different media comprising organic semiconductors and hence the formation of different colour light emitting pixels associated with an array of light emitting diodes.

Preferably, the medium and/or further medium comprises at least one of: a resin, an epoxy and a polymer.

Advantageously, the organic semiconductors are tunable for full dissolution in the different types of media, enabling a range of processing techniques to be employed in the formation of multicolour LED arrays.

Preferably, the method comprises patterning an insulating layer on a light emitting diode array, thereby to define a perimeter of a light emitting surface of at least one light emitting pixel.

Advantageously, the insulating layer separates regions associated with light emitting surfaces of light emitting diodes, in which light converting organic semiconductors are deposited. Beneficially, the insulating layer prevents the medium comprising organic semiconductors from spreading from one light emitting surface associated with one light emitting diode device to another light emitting surface associated with another light emitting diode device. Accordingly, a self-aligning method is provided, where the organic semiconductors dispersed in the medium is straightforwardly selectively deposited to associate with light emitting diode devices to form light emitting surfaces that emit light at a down converted wavelength with respect to the primary peak wavelength of light emitted by the light emitting diode devices in the array of light emitting diode devices.

Preferably, the method comprises depositing a layer of insulating material on the light emitting diode array and selectively etching the insulating material to provide the patterned insulating layer.

Advantageously, selective etching if a layer of insulating material provides a controllable and efficient mechanism to fence areas associated with light emitting surfaces of light emitting diode devices, such that colour conversion material is enabled selectively to self-align within the fenced areas, thereby forming light emitting surfaces of light emitting pixels that provide light emission at controllable wavelengths.

Preferably, the method comprises depositing a conformal reflective layer on the patterned insulating layer and etching the conformal reflective layer thereby to provide a light emitting surface associated with the light emitting diode of the at least one of the plurality of light emitting pixels. Preferably, the method comprises depositing the medium and/or the further medium on the light emitting diode array after etching the conformal reflective layer.

Advantageously, the reflective layer provides optical isolation for the colour conversion material provided by the organic semiconductors dispersed in the medium, as the reflective material is formed on the insulating layer that defines the perimeter of light emitting pixels.

Preferably, the method comprises curing the medium and/or the further medium and planarising a surface of the light emitting diode array.

Advantageously, planarization removes unwanted material, enabling access to layers that were previously covered, whilst providing a relatively flat and smooth surface for subsequent processing steps.

Preferably, the method comprises forming a passivation layer on the light emitting diode array, thereby to protect the medium and/or the further medium.

Advantageously, the passivation layer protects multiple light emitting pixels associated with the array of light emitting diode devices in a single protective step.

Preferably, the organic semiconductors and/or the further organic semiconductors comprise conjugated organic semiconductors having a plurality of conjugated structures, preferably wherein the organic semiconductors and/or further organic semiconductors are formed from organic semiconductor material, more preferably wherein the plurality of conjugated structures comprises a core and an arm, yet more preferably wherein at least two of the plurality of conjugated structures have a different functional property.

Advantageously, organic semiconductors, such as down converting organic semiconductors, have the ability to tune the molecular structure to achieve targeted physical properties. The organic semiconductors can achieve specific values for the ionization potential or electron affinity, absorption and emission characteristics, charge transport properties, phase behavior, solubility, and processability. Specific to the requirements of a monolithic RGB micro LED display the ability to make subtle structural changes to the organic semiconductor allows full control over the display performance.

Preferably, one functional property is absorption at the first primary peak wavelength and wherein one functional property is emission of absorbed light at the second primary peak wavelength.

Advantageously, organic semiconductors absorb input light with a first primary peak wavelength from light emitting diodes in the light emitting diode array and emit light at a determined second primary peak wavelength that is different to the first primary peak wavelength. Accordingly, RGB arrays (and other multicolour arrays) of light emitting pixels are enabled.

Preferably, the light emitting diode array is a high resolution monolithic micro LED array, preferably wherein the method comprises forming a reflective layer between at least two of the light emitting diodes in the high resolution monolithic micro LED array, more preferably wherein the high resolution monolithic LED has a pixel pitch less than 10 µm, preferably less than 4 µm. Preferably, the plurality of light emitting pixels each have a light emitting surface that is less than or equal to 100 µm$^2$, preferably less than 16 µm$^2$.

Advantageously, high resolution arrays are provided by the combination of organic semiconductors and monolithic LED arrays, where pixel size is reduced compared with known techniques. Reduced pixel size in combination with reduced pixel pitch is enabled without using photolithographical or inkjet printing techniques that may otherwise cause the colour conversion material to degrade.

Further aspects of the invention will be apparent from the description and the appended claims.

DETAILED DESCRIPTION OF AN EMBODIMENT OF THE INVENTION

A detailed description of embodiments of the invention is described, by way of example only, with reference to the figures, in which:

FIG. 4E shows a cross-sectional view of a further processed version of the monolithic LED array of FIG. 4E;

In order to address deficiencies in the prior art, an array of light emitting diodes comprising a plurality of light emitting pixels and a method of forming an array of light emitting diodes comprising a plurality of light emitting pixels is described with reference to FIGS. 1 to 4. It is described how down converting organic semiconductors are dispersed in a medium thereby to enable improved processing of colour converting materials in conjunction with monolithic LED arrays, thereby to facilitate the provision of high resolution monolithic LED arrays having light emitting pixels that have smaller light emitting surfaces and that are closer together than conventional techniques allow. Advantageously, the methods described enable such high resolution monolithic LED arrays having a plurality of light emitting pixels to be created without using lithographical or inkjet patterning processes to form colour conversion regions associated with light emitting diodes in the light emitting diode array, and are therefore not subject to the deleterious effects of such lithographical and inkjet patterning processing, as seen in conventional techniques for forming colour conversion regions using quantum dots.

Figure 1A:
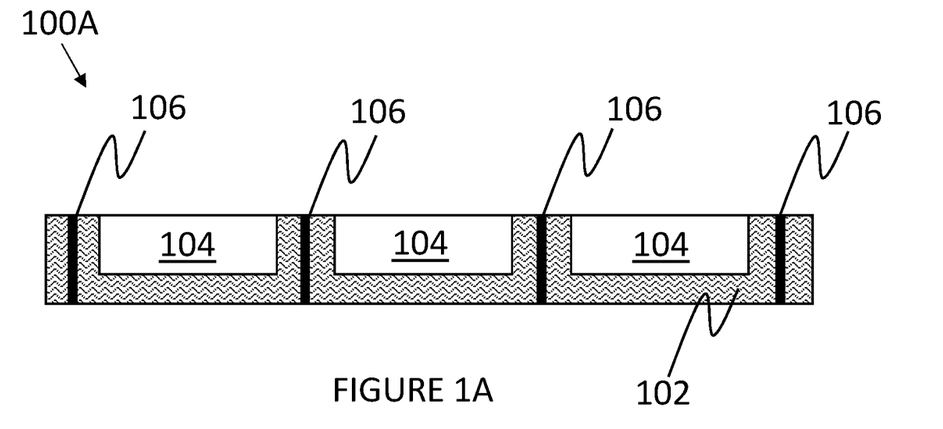
FIG. 1A shows a cross-sectional view of a monolithic LED array.

A method for forming a monochrome monolithic LED array comprising a plurality of light emitting pixels is described with reference to FIG. 1A to 1F, where the primary peak wavelength emitted by the light emitting pixels is different to the primary peak wavelength emitted by the LEDs in the array. FIG. 1A shows a cross-sectional view 100A of a section of a monolithic LED array. Whilst reference is made to cross-sectional views and layers as seen in cross-section, the skilled person understands that the layers extend laterally in a three-dimensional array to provide planar layers suitable for functional displays, for example.

There are shown three LED structures 104 that form part of a monolithic LED array. However, in further examples the array is not limited in the number of LED structures 104.

The LED structures 104 are nitride-based epitaxially grown compound crystalline semiconductor LEDs. In further examples, other LEDs are used, such as other group III-V, or group II-VI based materials. Advantageously, the LED structures 104 are grown monolithically, thereby to provide high quality material with excellent uniformity and efficiency, without a requirement to transfer individual LED devices. Beneficially, the monolithic LED array is coupled to a backplane in order to enable control of individual LED structures 104 in the monolithic array. The LED structures 104 are grown as part of a monolithic array of LEDs using metal organic chemical vapour deposition (MOCVD). In further examples, alternative and/or additional techniques are used to form the LED structures 104 as part of a monolithic array, such as molecular beam epitaxy (MBE) and other suitable deposition/growth techniques. In further examples, other additional and/or alternative semiconductor fabrication and processing techniques are used to provide the monolithic array of LED structures 104.

The LED structures 104 are formed on a region of gallium nitride (GaN) 102 and are shown to be embedded in the GaN 102 region. In further examples, additionally or alternatively, LED structures 104 are formed on a different material and are positioned to be proud of a top surface of a monolithic light emitting diode array such that the surface of the monolithic LED array has topological variations. In further examples, the region of GaN 102 is coupled to a complementary metal oxide semiconductor (CMOS) backplane such that the individual LED structures 104 of the monolithic array are independently addressable, thereby to control light emission from the array. The individual electrical connections to the LED structures 104 are not shown and the skilled person understands that such electrical connections are implementable in a variety of ways.

A metallic layer 106 is formed around the perimeter of the LED structures 104 in the monolithic array thereby to provide optical isolation and to prevent optical cross talk between LED structures 104. In further examples, alternatively or additionally, the metallic layer 106 is not used. In further examples, alternative or additional layers are used between LED structures 104 in the monolithic array in order to provide isolation of LED structures 104, including optical isolation of LED structures 104.

Figure 1B:
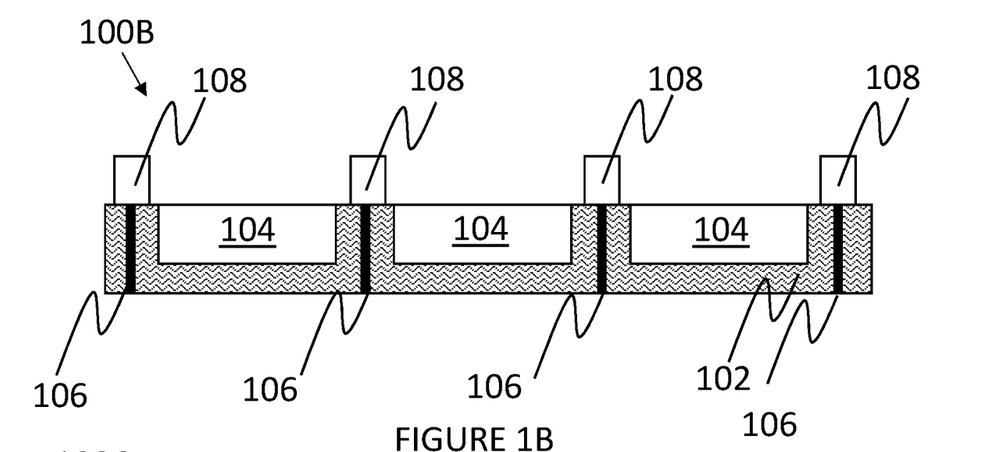
FIG. 1B shows a cross-sectional view of a processed version of the monolithic LED array of FIG. 1A.

Once an array of monolithic LED structures 104 has been provided, an insulating layer 108 is patterned on the surface of the array, as shown in the cross-sectional view 100B of FIG. 1B. The insulating layer 108 is patterned such that the light emitting surface of each pixel, defined by the light emitting surfaces of the LED structures 104, is exposed. The insulating layer 108 is patterned by forming a layer of insulating material on the monolithic array of LED structures 104 and performing anisotropic etching of the insulating material, thereby to expose a light emitting surface associated with each light emitting diode structure 104, whilst leaving a patterned insulating layer 108 provided around the perimeter of each of the LEDs, enabling a light emitting surface for each of the LED structures 104 to be defined and allowing for subsequent deposition of material to be confined to individually selected LED structures 104. The insulating layer 108 is a silicon dioxide patterned layer. If further examples, alternatively or additionally, different insulating materials are used to form the patterned insulating layer 108.

Figure 1C:
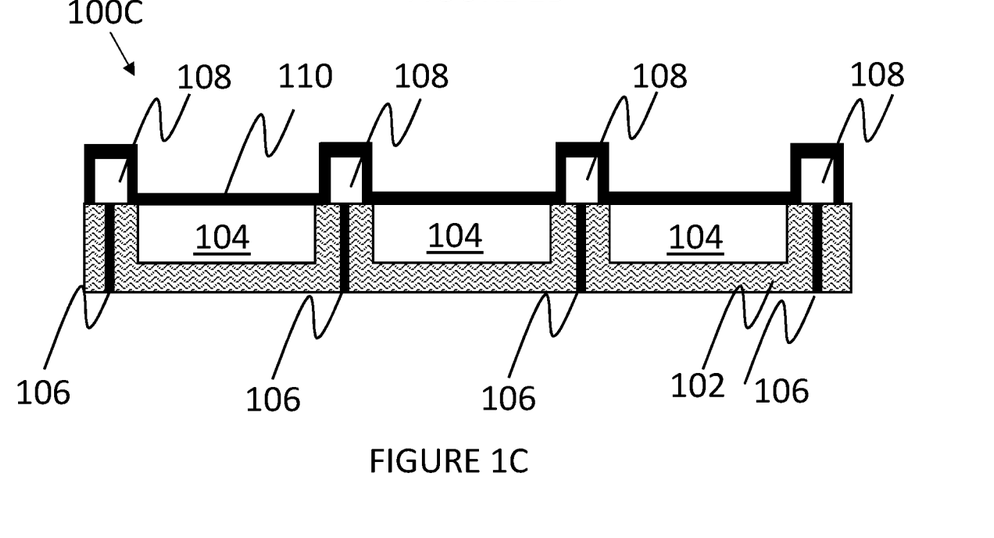
FIG. 1C shows a cross-sectional view of a further processed version of the monolithic LED array of FIG. 1B.

Once the insulating layer 108 has been formed on the monolithic array of LED structures 104, as described with reference to FIG. 1B, a conformal reflective layer is deposited onto the surface of the array. The reflective layer 110 is an aluminium layer. In further examples, alternatively or additionally, different reflective layers used, such as different metallic reflective layers or other reflective material layers. In further examples the reflective layer 110 is omitted. Once the conformal reflective layer 110 has been deposited as shown at FIG. 1C, the process moves to FIG. 1D. Whilst the conformal reflective layer 110 is shown in a cross-sectional view 100C, the skilled person understands that the conformal layer extends laterally across the surface of the array of LED structures 104, as required.

Figure 1D:
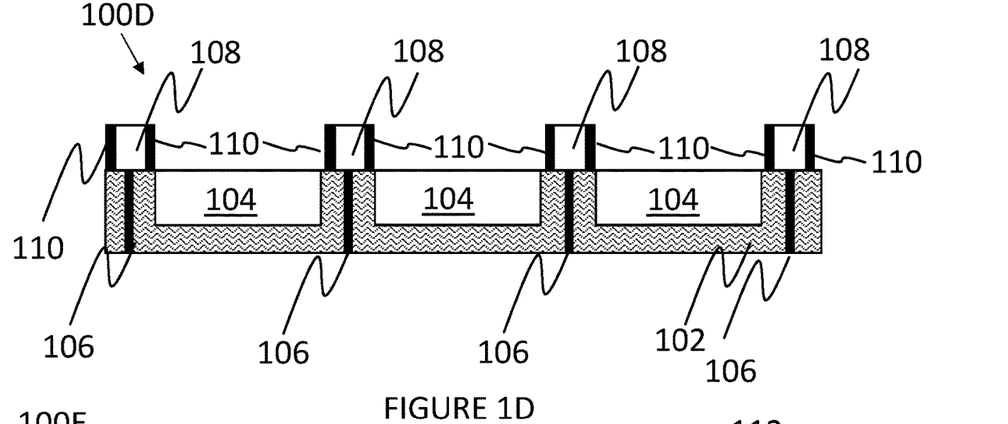
FIG. 1D shows a cross-sectional view of a further processed version of the monolithic LED array of FIG. 1C.

At FIG. 1D there is shown a cross-sectional view 100D of a monolithic array of LED structures 104 where an anisotropic etch has been performed thereby to leave metallic reflective layers 110 on the sidewalls of the insulating layer 108 that was patterned onto the surface of the array and not on the light emitting surface associated with individual LED structures 104. The anisotropic etch selectively exposes light emitting surfaces associated with individual LED structures 104 in the array of LED structures 104. Beneficially, the metallic reflective layers 110 on the sidewalls of the insulating layer 108 provides for optical definition of light emitting surfaces of light emitting pixels and thus better contrast between pixels. The process then moves on to provide the structure shown in FIG. 1E.

Figure 1E:
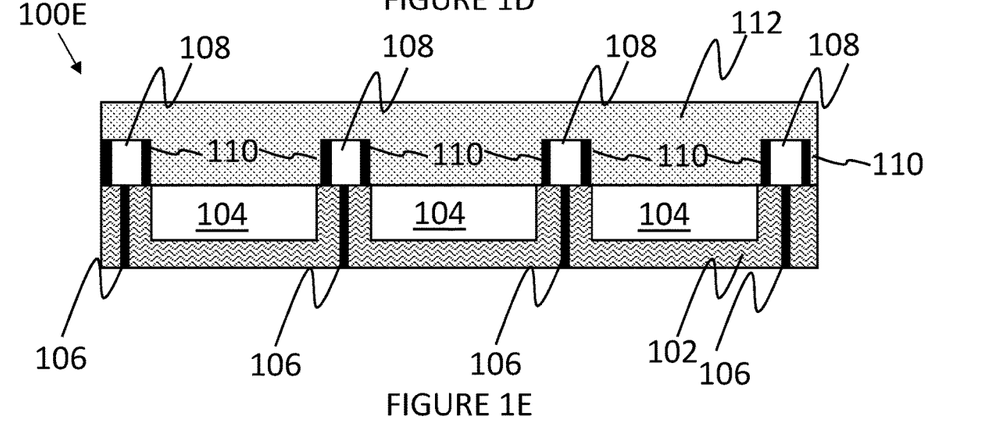
FIG. 1E shows a cross-sectional view of a further processed version of the monolithic LED array of FIG. 1D.

At FIG. 1E there is shown a cross-sectional view 100E of the array described with reference to FIG. 1D with a organic semiconductor based layer deposited onto the array. It is known that down converting organic semiconductors can be tuned in order to achieve targeted physical properties. In particular, advantageously, organic semiconductors can achieve specific values for the ionisation potential or electronic affinity, absorption and emission characteristics, charged transport properties, phase behaviour, solubility, and processability. Typically, organic semiconductors are conjugated organic semiconductors comprising a plurality of conjugated structures. In an example, such conjugated structures include a core and arm. The functionality of these constituent parts of the macro molecule are tuned in order to provide particular characteristics.

Macromolecules are discussed in *Acc. Chem. Res* 2019, 52, 1665 to 1674 and *J. Mater. Chem. C,* 2016, 4, 11499, for example. Macromolecules that are tunable include conjugated organic semiconductor comprising a plurality of conjugated structures. These are typically organic semiconductors. The plurality of conjugated structures can be formed to have a different functional properties, for example, different absorption and/or emission characteristics associated with each of the different conjugated structures.

Advantageously, such organic semiconductor can efficiently absorb light at one wavelength and convert it to a different wavelength that is emitted, even using a thin layer of organic semiconductors. An elegant and advantageous technique for processing such organic semiconductors dispersed in a medium is demonstrated below with respect to FIGS. 1 to 4. Beneficially, the method does not rely on lithography or inkjet patterning processes that are known to otherwise degrade the colour conversion material in conventional colour converting materials, such as quantum dots. Advantageously, a self-aligning method is described that nevertheless enables the creation of small features suitable for micro LED arrays without a need to use lithographical or inkjet patterning processes to form colour converting regions.

The organic semiconductor material 112 comprises colour converting organic semiconductors dispersed in a medium. Advantageously, the ability to tune the organic semiconductor enables the colour gamut of the final display to be readily controlled. The organic semiconductor material 112 absorbs light from the LED structures 104 and emits light at a different, down converted wavelength. The primary peak wavelength of light from the LED structures 104 is longer that the primary peak wavelength of light emitted from the colour converting organic semiconductor material 112. The light emitted from the LED structures 104 has a primary peak wavelength that is blue (approximately 450 nm). In further examples, the light emitted from the LED structures 104 has a different primary peak wavelength of light. The organic semiconductor material 112 is configured to absorb light and emit light with a primary peak wavelength that corresponds to green light (approximately 550 nm). Additionally, or alternatively, in further examples, the organic semiconductor material 112 is configured to emit light with a primary peak wavelength that corresponds to red light (approximately 650 nm). Additionally or alternatively, in further examples, the organic semiconductor material 112 comprises organic semiconductors that are configured to emit light at multiple wavelengths. Advantageously, the ability to tune the organic semiconductor allows the option for multiple colour multiple emission from a single pixel aiding the final display colour gamut. Additionally or alternatively, in further examples the organic semiconductor material 112 comprises different organic semiconductors that emit light at different wavelengths of light from each other, in response to absorbing light from the LED structures 104.

The organic semiconductor material 112 is deposited on the monolithic array of LED structures 104 by slit coating deposition techniques. In further examples, alternative or additional techniques are used in order to deposit the organic semiconductor material 112 on the monolithic array of LED structures 104. For example, spin coating is used in a further example. The medium in which the organic semiconductor is dispersed is a resin. In further examples, alternative or additional media are used such as epoxy material or polymer material. The organic semiconductors are dispersed in the medium to form the organic semiconductor material 112 prior to deposition on the surface of the array. The medium comprising the organic semiconductors is deposited on the LED structures 104 in between the insulating layer 108.

Figure 1F:
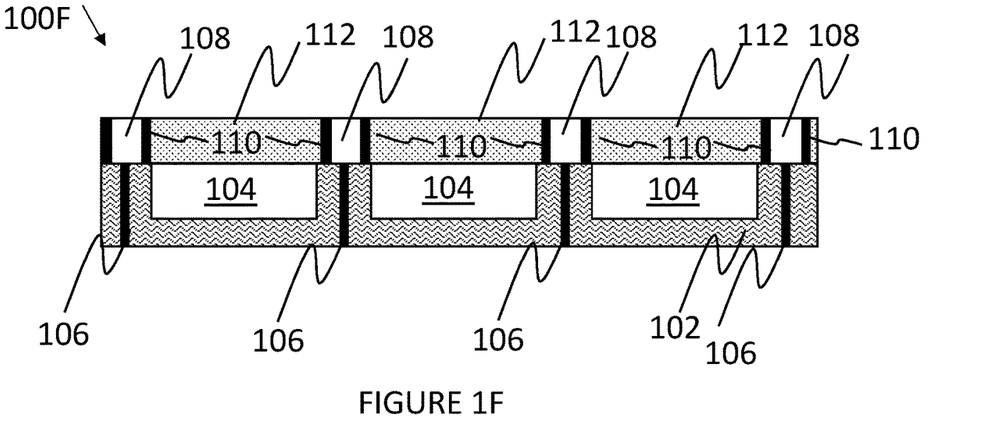
FIG. 1F shows a cross-sectional view of a further processed version of the monolithic LED array of FIG. 1E.

Once the organic semiconductor material 112 has been deposited the surface of the array is planarised. Such planarisation is performed using an anisotropic etch back process. This is shown at FIG. 1F. At FIG. 1F there is shown a cross-sectional view 100F of the processed micro LED array shown at FIG. 1E. Advantageously, a planarised structure is provided, where the organic semiconductor material 112 defining pixels associated with each LED structure 104 are isolated laterally by an insulating layer 108 defining the perimeter of the pixels, as well as the reflective layer 110, such that the pixels are optically isolated from one another.

The micro LED array has LED structures 104 that provide source input light to the colour conversion regions provided by the organic semiconductor material 112 that define different pixels in the array. Whilst planarisation is performed using an anisotropic etch back process, in further examples, additionally or alternatively, chemical mechanical polishing is used to planarise the structure.

Figure 2A:
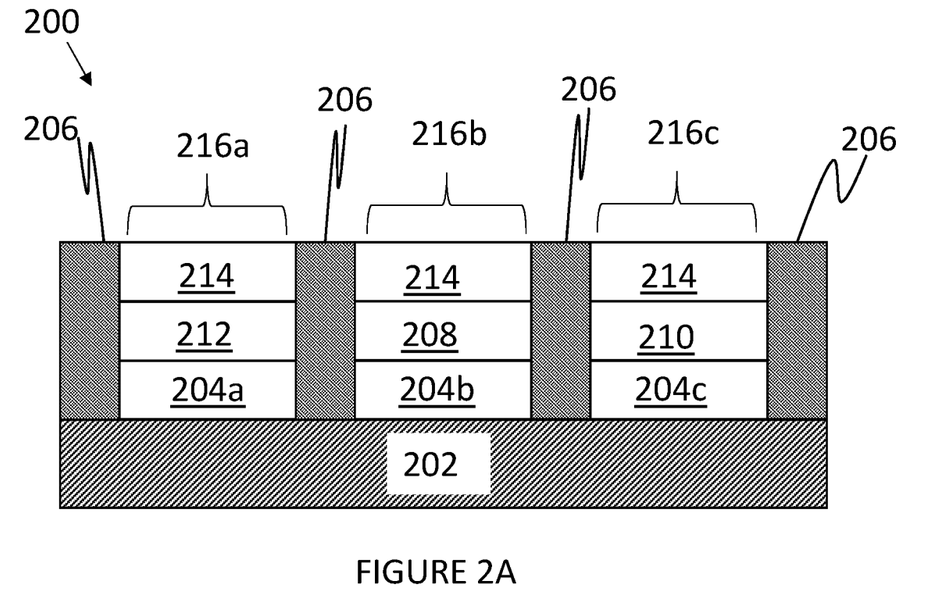
FIG. 2A shows a cross-sectional view of multicolour LED array.

Whilst the colour conversion layer provided by the organic semiconductor material 112 is shown to convert light from the LED structures 104 to a different wavelength of light. The skilled person understands that in further examples different pixels have different organic semiconductor materials 112 deposited in them thereby to provide different colour pixels. An example of this is described with respect to FIG. 2, which shows a view 200 multicolour monolithic LED array.

FIG. 2A shows a cross-sectional view 200 of a multicolour monolithic LED array showing three light emitting pixels 216a, 216b, 216c. There is shown a complementary metal oxide semiconductor (CMOS) backplane 202, upon which there is provided an array of micro LEDs 204a, 204b, 204c. The CMOS backplane 202 is configured to work with the micro LEDs in order selectively to control light emission from the array of micro LEDs. There are three micro LEDs 204a, 204b, 204c shown in FIG. 2A. The micro LEDs 204a, 204b, 204c are nitride based epitaxial crystalline semiconductor LEDs configured to emit light with a primary peak wavelength that is blue (approximately 450 nm). In order to provide a red-green-blue (RGB) display, the blue light emitted by the micro LED structures 204a, 204b, 204c is converted using colour conversion layers that are formed on the micro LEDs 204a, 204b, 204c.

The view 200 of FIG. 2A shows a first micro LED 204a that is configured to emit light with a primary peak wavelength that is blue (approximately 450 nm), upon which there is deposited a clear resin 212. Upon the clear resin 212 there is deposited a passivation, protective layer 214. The protective layer 214 is transparent to visible light and forms at least part of a light emitting surface associated with the micro LED 204a. The micro LED 204a, the clear resin 212 and the protective layer 214 form a first light emitting pixel 216a.

There is also shown a second micro LED 204b that is configured to emit light with a primary peak wavelength that is blue (approximately 450 nm), upon which there is formed a colour conversion layer 208 that is configured to convert light from the micro LED structure 204b such that input light with a primary peak wavelength that is blue is converted to a primary wavelength that is red. Upon the colour conversion layer 208 there is a passivation, protective layer 214. The protective layer 214 is transparent to visible light and forms at least part of a light emitting surface associated with the micro LED 204b. The micro LED 204b, the colour conversion layer 208 and the protective layer 214 form a second light emitting pixel 216b.

There is also shown a third micro LED 204c that is configured to emit light with a primary peak wavelength that is blue (approximately 450 nm). Upon the third blue micro LED 204c, there is provided a colour conversion layer 210 that is different to the colour conversion layer 208 associated with the second micro LED 204b. The colour conversion layer 210 is configured to receive input light from the third micro LED 204c and convert it from light that has a primary peak wavelength that is blue light to light that has a primary peak wavelength that is green. Upon the colour conversion layer 210 there is a passivation, protective layer 214. The protective layer 214 is transparent to visible light and forms at least part of a light emitting surface associated with the micro LED 204b. The micro LED 204a, the colour conversion layer 210 and the protective layer 214 form a third light emitting pixel 216c.

The blue light emitting micro LEDs 204a, 204b, 204c are epitaxially grown as a monolithic array of blue light emitting micro LEDs. In-between each of the light emitting pixels 216a, 216b, 216c, formed by the combination of a micro LED with or without colour conversion layers, there is provided an infill 206. The infill 206 that separates the light emitting pixels. In further examples, additional or alternative structures and/or layers are used to separate the micro LEDs 204a, 204b, 204c and/or the light emitting pixels 216a, 216b, 216c. Whilst the micro LEDs 204a, 204b, 204c are configured to emit blue light at the same wavelength, in further examples, alternative or additional LEDs are provided in the array, where the alternative or additional LEDS emit light at a different predetermined primary peak wavelength. For example, blue and green LEDs might form part of a monolithic array of LEDs and red colour conversion material is selectively deposited on some of the LEDs, for example some of the blue LEDs, thereby to provide a RGB display.

Figure 2B:
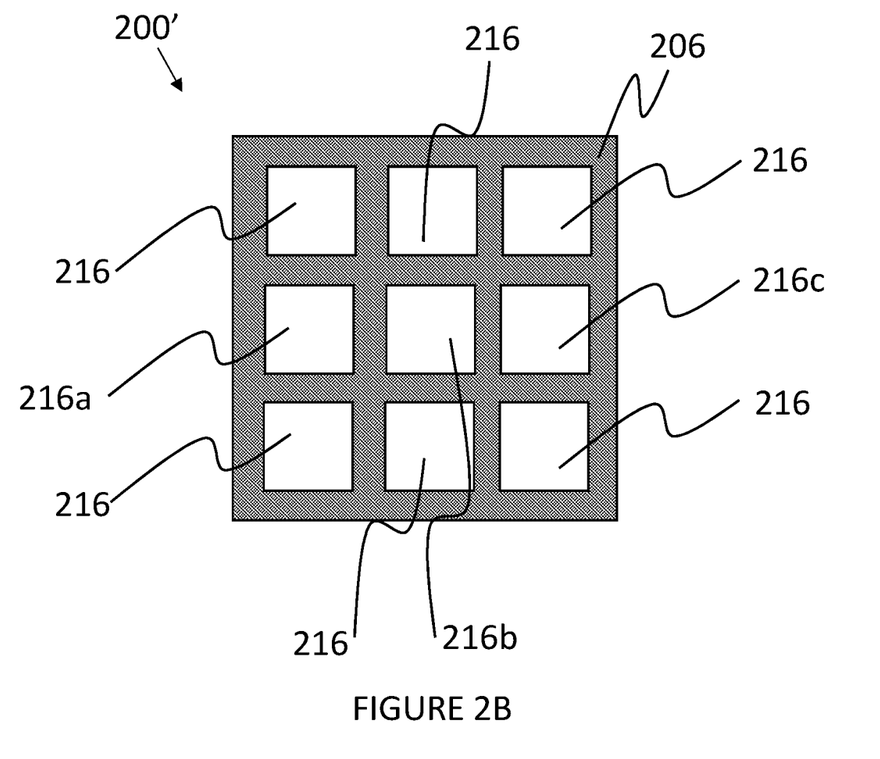
FIG. 2B shows a plan view of the multicolour LED array of FIG. 2A.

FIG. 2B shows a plan view 200' of the array of light emitting pixels described with respect to FIG. 2A. Each LED pixel 216 has a light emitting surface (these are shown as square surfaces at FIG. 2B—in further examples the light emitting surfaces have different shapes and are in different configurations). The pixels 216 correspond to any of the combinations of micro LED 204a, 204b, 204c with colour conversion layers 208, 210 or resin 212 described with respect to FIG. 2A and in FIG. 2B there is shown blue green and red light emitting pixels 216a, 216b, 216c described with respect to FIG. 2A amongst other light emitting pixels 216. Whilst the light emitting pixels 216a, 216b, 216c of FIG. 2A and FIG. 2B are shown in a particular arrangement, in further examples, arrays of light emitting pixels comprise any appropriate number of light emitting pixels in any suitable arrangement and with any suitable light emitting surface associated with each of the light emitting pixels.

The light emitting pixels 216 have a light emitting surface corresponding to the plan view area of the pixels 216. Whilst the pixels are shown to be square in plan view, in further examples, alternatively or additionally the pixel plan view shapes are different. For example, the pixels 216 may assume a hexagonal shape light emitting surfaces.

Figure 3:
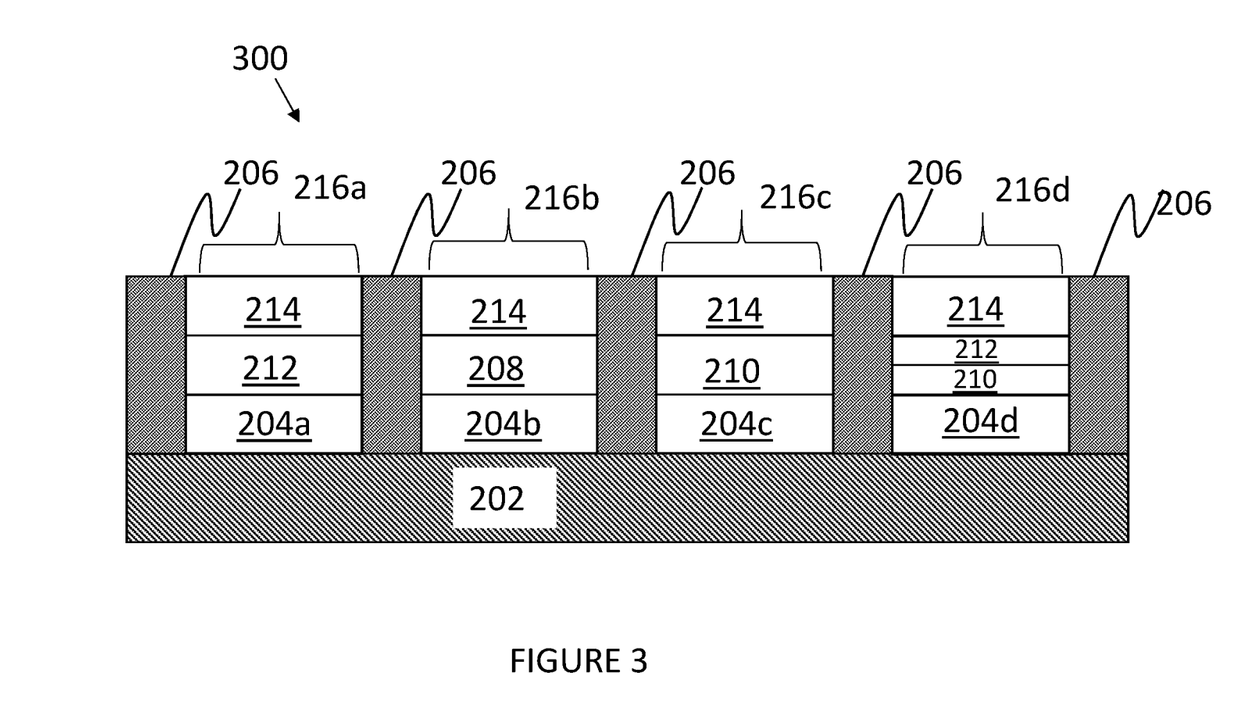
FIG. 3 shows a cross-sectional view of a multicolour LED array.

FIG. 3 demonstrates a further cross sectional view 300 of an implementation of organic semiconductors dispersed in media to provide colour conversion films with different pixels without the need for lithographical or inkjet printing techniques. Common elements are shown with respect to FIG. 2A. Additionally, a further micro LED 204d is shown. Upon this layer there is a thinner colour conversion layer 210 than that associated with micro LED 204c, along with a clear resin 212. This enables white light to be produced at a pixel 216d as part of a red-green-blue-white array. This enables improved emission, even at low light conditions.

Whilst one LED 204c is shown at FIG. 3 with an associated colour conversion layer 210 that is thicker than the colour conversion layer 210 associated with LED 204d, in further examples, alternatively or additionally, different thicknesses, sizes, shapes and combinations of colour conversion layers forming light emitting pixels surfaces are implemented at different pixels in order to provide light suitable for the application to which it is associated.

FIG. 4 illustrates a method of forming a multicolour high resolution micro LED array of light emitting pixels. The method enables the efficient formation of arrays of light emitting pixels that emit different primary peak wavelengths on a smaller scale than is achievable with quantum dot material and without processing the colour conversion material in a way that deleteriously affects its ability to convert light from one LED input colour to a different output colour.

Figure 4A:
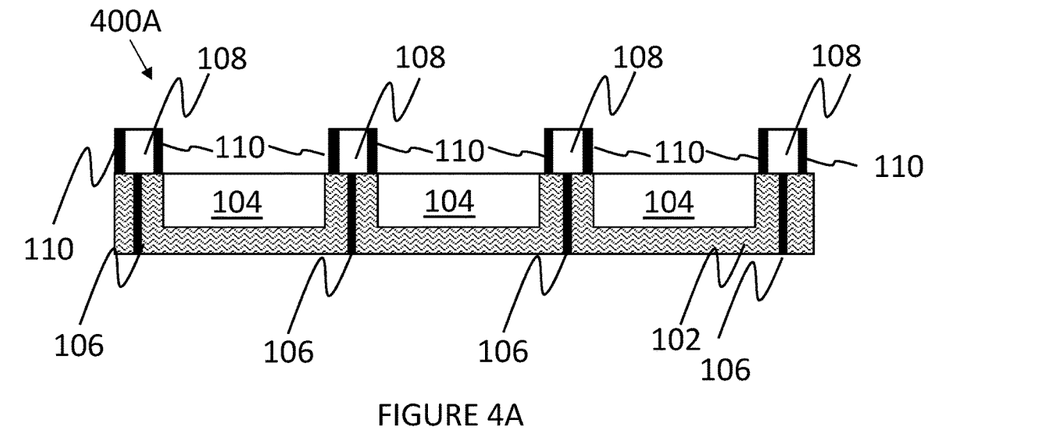
FIG. 4A shows a cross-sectional view of a processed version of the monolithic LED array of FIG. 1D.

FIG. 4A shows a processed monolithic array 400A of LED structures 104 formed in the same manner as the structure provided with reference to FIG. 1D. However, instead of depositing a organic semiconductor material on the processed monolithic array of LEDs 104, an optically clear resin 402 is formed to cover LED structures 104 in the array of LEDs that are not to be associated with a colour converting organic semiconductor material that is to be deposited. This is shown at the processed array 400B of FIG. 4B. The optically clear resin 402 can be formed using photodefinable methods since it does not comprise organic semiconductors (which may otherwise be affected by the lithographical techniques involved for photodefinable methods).

Figure 4B:
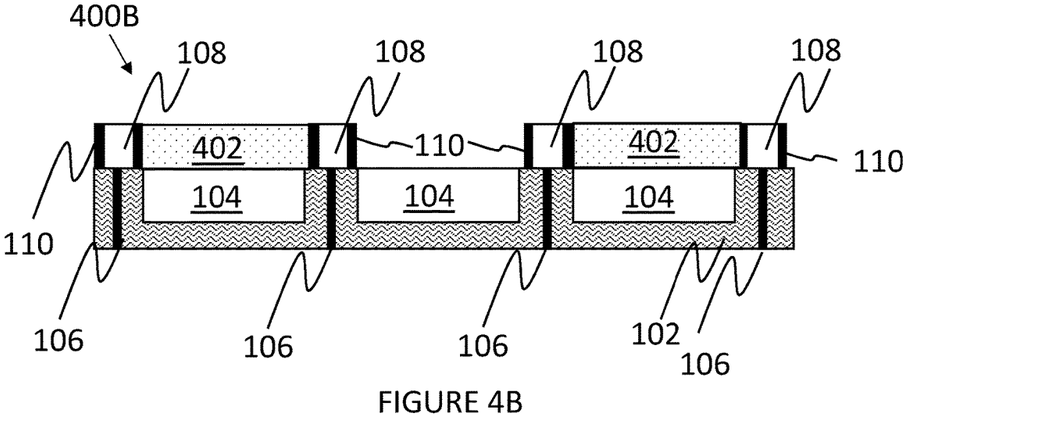
FIG. 4B shows a cross-sectional view of a further processed version of the monolithic LED array of FIG. 4A.
Figure 4C:
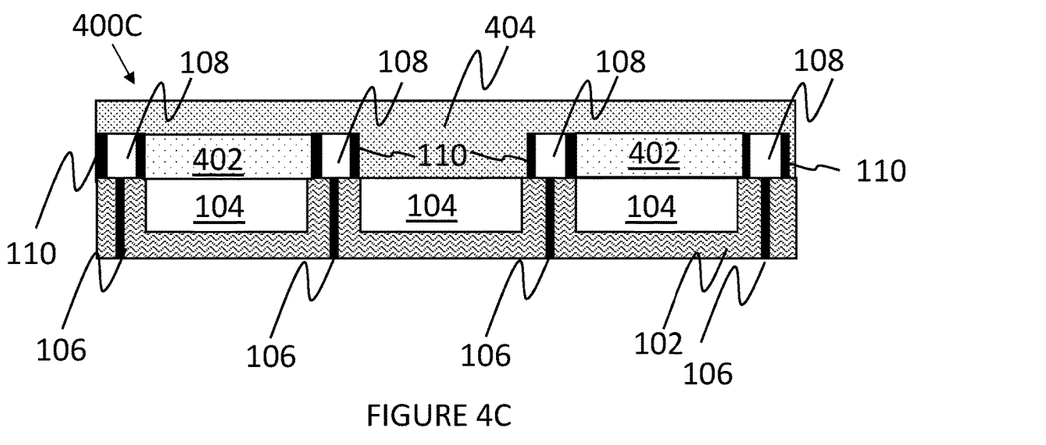
FIG. 4C shows a cross-sectional view of a further processed version of the monolithic LED array of FIG. 4B.

Once selected LEDs have been covered with optically clear resin 402 as described with reference to FIG. 4B, the process moves to FIG. 4C. At FIG. 4C there is shown processed array 400C where a organic semiconductor material 404 that has been deposited on the processed monolithic array of LED structures 104. The organic semiconductor material 404 is a medium comprising organic semiconductors that are configured to absorb light from the LED structures 104 and down convert it such that light is emitted with a wavelength that is shorter than the input light absorbed from the LED structures 104, as describe with reference to FIGS. 1A to 1F. The organic semiconductor material 404 is configured to absorb blue light and emit green light. Advantageously, the efficiency of the organic semiconductor layer means that a blue blocking filter is not required over the organic semiconductor layer. The organic semiconductor material 404 comprises organic semiconductors mixed with a medium prior to deposition using suitable processing techniques. The medium is a resin. In further examples, the medium is additionally, or alternatively, an epoxy or polymer. Once the organic semiconductor material 404 has been deposited, the structure is planarised using an anisotropic etch process. This is shown at FIG. 4D.

Figure 4D:
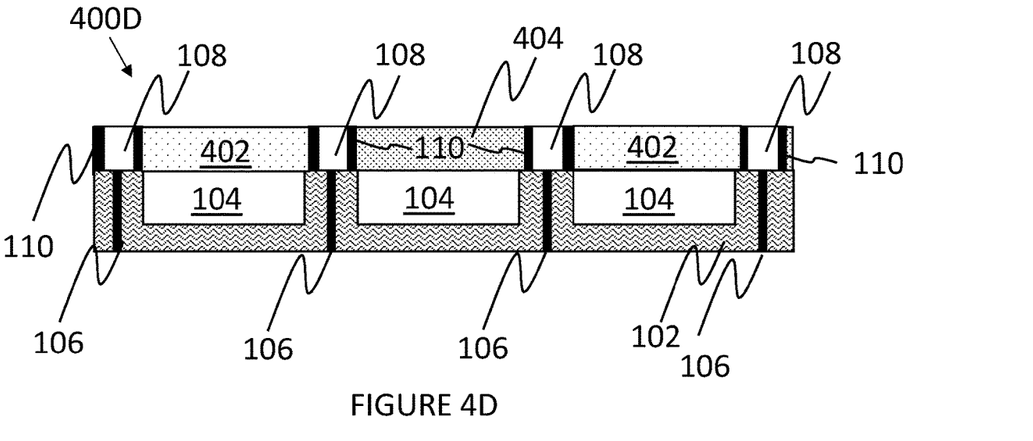
FIG. 4D shows a cross-sectional view of a further processed version of the monolithic LED array of FIG. 4C.

At FIG. 4D there is shown the planarised structure 400D that has removed the organic semiconductor material 404 to expose the optically clear resin 402 formed to selectively cover some of the LED structures 104. Whilst the planarisation is performed using an anisotropic etch back process, in further examples, additionally or alternatively, a chemical mechanical polishing process is used to planarise the structure 400D. Once the structure 400D has been planarised, the optically clear resin 402 is selectively removed from covering LED structures 104 with which a different colour conversion organic semiconductor is to be associated.

Figure 4E:
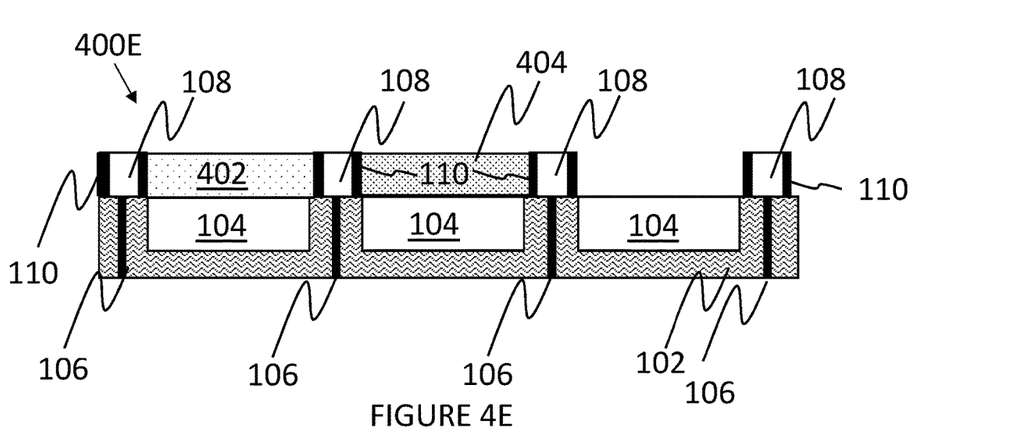
FIG. 4E shows a cross-sectional view of a further processed version of the monolithic LED array of FIG. 4D.

FIG. 4E shows a structure 400E that is the structure 400D of FIG. 4D with the optically clear resin 402 removed from covering one of the LED structures 104. Once the optically clear resin 402 has been selectively removed, a further medium comprising further organic semiconductors is deposited on the array.

Figure 4F:
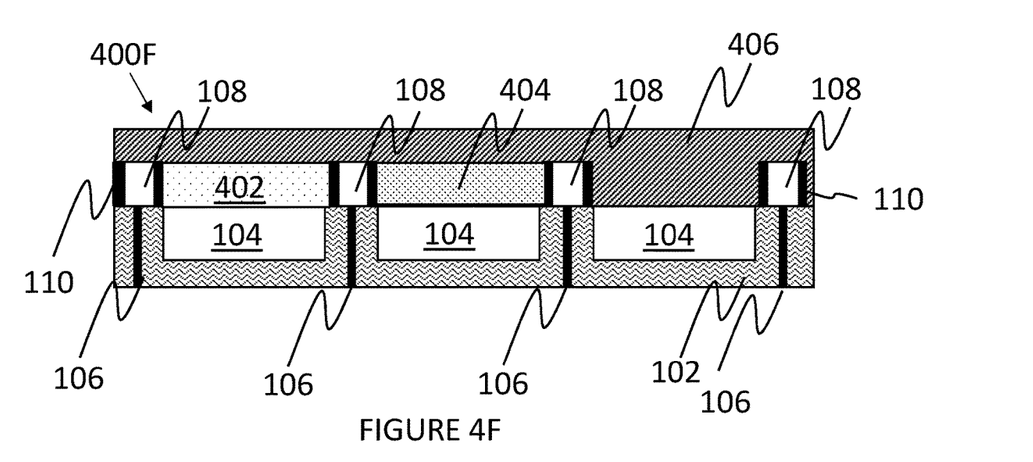
FIG. 4F shows a cross-sectional view of a further processed version of the monolithic LED array of FIG. 4F.

FIG. 4F shows a structure 400F that is the structure 400E of FIG. 4E with an additional organic semiconductor material 406 deposited on the structure 400E. The organic semiconductor material 406 is formed from a medium in which organic semiconductors are dispersed. The organic semiconductor material 404 is a medium comprising organic semiconductors that are configured to absorb light from the LED structures 104 and down convert it such that light is emitted with a wavelength that is shorter than the input light absorbed from the LED structures 104. The organic semiconductors are configured to absorb blue light and emit red light. Advantageously, the efficiency of the organic semiconductor layer means that a blue blocking filter is not required over the organic semiconductor layer. The organic semiconductor material 404 comprises organic semiconductors mixed with a medium prior to deposition. The medium is a resin. In further examples, the medium is additionally, or alternatively, an epoxy or polymer. Once the organic semiconductor material 406 has been deposited, the structure is planarised using an anisotropic etch process. This is shown at FIG. 4G.

Figure 4G:
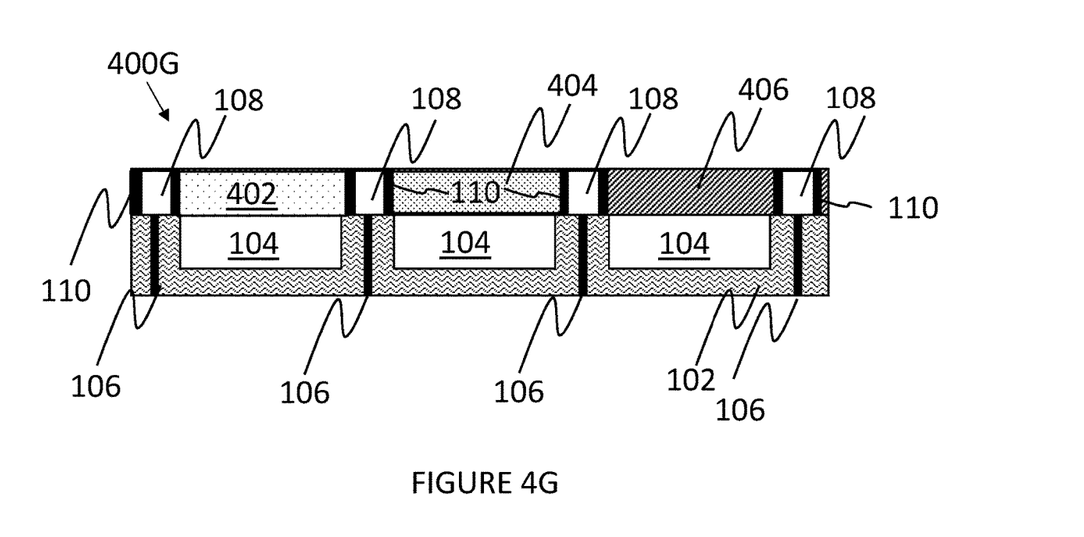
FIG. 4G shows a cross-sectional view of a further processed version of the monolithic LED array of FIG. 4G.
Figure 4H:
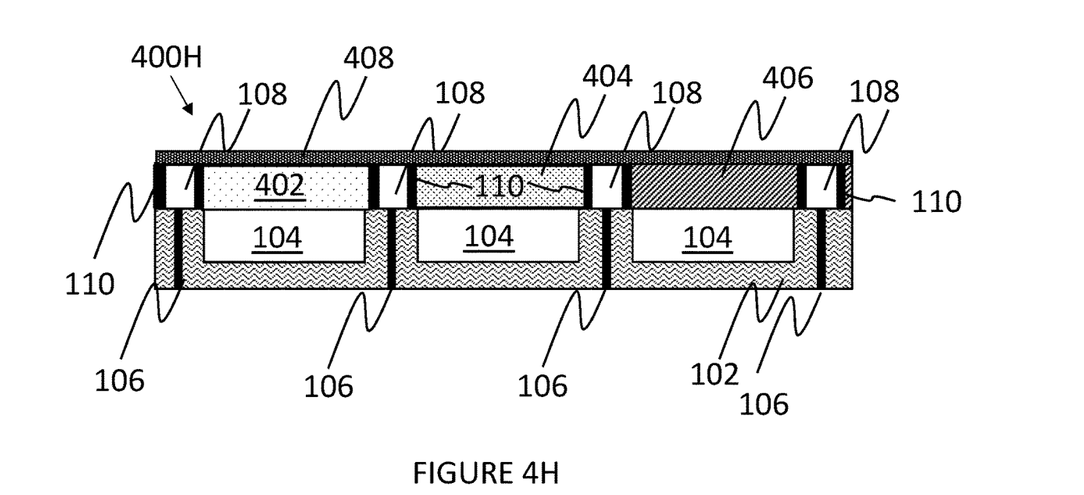

At FIG. 4G there is shown the planarised structure 400G that has removed the organic semiconductor material 406 to expose the optically clear resin formed to selectively cover some of the LEDs and the organic semiconductor material 404 associated with some of the LED structures 104. Whilst the planarisation is performed using an anisotropic etch back process, in further examples, additionally or alternatively, a chemical mechanical polishing process is used to planarise the structure. Once the structure has been planarised, the structure 400G of FIG. 4G is covered with a passivation layer 408. This is shown in the structure 400H at FIG. 4H. The passivation layer 408 is formed using an atomic layer deposition technique. In further examples, the passivation layer 408 is formed using other appropriate techniques.

The resultant structure formed as described above is a monolithic array of LED structures 104 that are configured independently emit light with a primary peak wavelength. The light emitted by the LED structures 104 is absorbed at the corresponding organic semiconductor material 404, 406, or passes through the optically clear resin 402, such that light of three different colours is emitted. In further examples, alternatively or additionally, light emitting pixels are configured to emit light of further primary peak wavelengths. In yet further examples, multiple layers of different organic semiconductor materials are associated with individual LED structures 104 such that light with multiple wavelengths of light are emitted. In yet further examples, organic semiconductor materials are used that comprise different organic semiconductors with different functional properties.

Whilst a cross-sectional view of three light emitting pixels and their associated light emitting diodes is described with reference to FIG. 4, the skilled person understands that arrays of any number of such light emitting pixels can be produced using the methods described herein, thereby to provide high resolution monolithic arrays of light emitting pixels based on the association of organic semiconductor-containing media and high resolution monolithic light emitting diode arrays.

Advantageously, a self-aligned process flow for providing a high resolution array of micro LED pixels is provided. The process avoids the need for lithographic or inkjet patterning processes when depositing the organic semiconductor material, therefore avoiding any associated deleterious effects whilst also enabling small features to be provided.

Advantageously, conjugated organic semiconductors can achieve full colour saturation within very thin films, typically in the order of 1 µm-2 µm without the requirement of an additional blue blocking filter. Quantum dot films require thickness in excess of 20 µm to achieve similar colour saturation performance. Advantageously, the full colour saturation within a thin film allows the organic semiconductor to define pixels at a smaller pitch than traditional quantum dot films. The methods described herein provide for high resolution micro LED based arrays of light emitting pixels with light emitting surfaces less than or equal to 100 µm² and preferably less than or equal to 16 µm². Moreover, the method described herein provide for high resolution micro LED based arrays of light emitting pixels wherein the high resolution monolithic LED has a pixel pitch less than 10 µm, preferably less than 4 µm. Whilst the methods and arrays described herein are done so with reference to micro LEDs, the skilled person understands that the examples are also applicable to different sized LEDs and different sized LED arrays.

Advantageously, the ability to tune the organic semiconductor allows its full dissolution within photo definable material allowing standard semiconductor processing techniques to be utilized. The utilization of existing techniques enables economic volume processing. Quantum dots tend to suffer from increased degradation in a photo definable medium and the described methods do not suffer from such a problem. Advantageously, the use of a thin colour conversion layer leads to significantly higher efficiencies over conventional quantum dots due to less re-absorption and, beneficially, the ability to tune the absorption and emission spectrum of the organic semiconductor leads to significantly higher efficiencies than in conventional colour conversion techniques.

What is claimed is:

1. A method of forming a high resolution monolithic micro light emitting diode array comprising a plurality of light emitting pixels with a pixel pitch less than 4 µm, the method comprising:

patterning an insulating layer on a light emitting diode array, thereby to define the perimeter of a light emitting surface of a first light emitting pixel associated with a first light emitting diode and the perimeter of a light emitting surface of a second light emitting pixel associated with a second light emitting diode;

depositing a conformal reflective layer on the patterned insulating layer and etching the conformal reflective layer thereby to expose the light emitting surfaces of the first light emitting pixel associated with the first light emitting diode and the second light emitting pixel associated with the second light emitting diode;

selectively covering the second light emitting diode with a material formed within the perimeter of the light emitting surface of the second light emitting pixel associated with the second light emitting diode;

subsequently depositing a medium in which organic semiconductors are dispersed within the perimeter of the light emitting surface of the first light emitting pixel associated with the first light emitting diode, wherein the first light emitting diode is configured to emit light of a first primary peak wavelength and wherein the organic semiconductors are configured to receive and convert input light of the first primary peak wavelength from the first light emitting diode to provide output light of a second primary peak wavelength;

planarizing the deposited medium in which organic semiconductors are dispersed; and forming a passivation layer on the light emitting diode array, thereby to protect the medium.

2. The method according to claim 1, wherein at least one further light emitting pixel comprises:

a further light emitting diode configured to emit light of the first primary peak wavelength; and further organic semiconductors dispersed in a further medium, wherein the further organic semiconductors are configured to receive and convert input light of the first primary peak wavelength from the further light emitting diode to output light of a third primary peak wavelength.

3. The method according to claim 2, wherein depositing the medium and/or further medium comprises slit coating or spin coating the medium and/or further medium.

4. The method according to claim 3, comprising selectively covering one or more light emitting diodes in the light emitting diode array with a material prior to depositing the medium and/or the further medium, thereby to enable selective deposition of the medium and/or further medium.

5. The method according to claim 4, wherein the material is at least one of:

a temporary material that is removable thereby to enable further deposition of the medium and/or the further medium on the selectively covered one or more light emitting diodes in a further distinct step after deposition of the medium and/or further medium on the light emitting diode array; and an optically transparent material that enables light emission from the selectively covered one or more light emitting diodes, wherein the one or more light emitting diodes are configured to emit light with the primary peak wavelength.

6. The method according to claim 1, wherein the medium and/or further medium comprises at least one of: a resin, an epoxy and a polymer.

7. The method according to claim 2, wherein the organic semiconductors and/or the further organic semiconductors comprise conjugated organic semiconductors having a plurality of conjugated structures, wherein the organic semiconductors and/or further organic semiconductors are formed from organic semiconductor material, wherein the plurality of conjugated structures comprises a core and an arm, and wherein at least two of the plurality of conjugated structures have a different functional property.

8. The method according to claim 7, wherein one functional property is absorption at the first primary peak wavelength and wherein one functional property is emission of absorbed light at the second primary peak wavelength.

9. The method according to 1, comprising depositing a layer of insulating material on the light emitting diode array and selectively etching the insulating material to provide the patterned insulating layer.

10. The method according to claim 1, comprising curing the medium and/or the further medium.

11. The method according to claim 1, wherein the plurality of light emitting pixels each have a light emitting surface that is less than or equal to 100 µm².

12. A high resolution monolithic micro light emitting diode array with a pixel pitch less than 4 µm, the high resolution monolithic micro light emitting diode array comprising:

a patterned insulating layer on a light emitting diode array defining the perimeter of a light emitting surface of a first light emitting pixel associated with a first light emitting diode and the perimeter of a light emitting surface of a second light emitting pixel associated with a second light emitting diode;

a conformal reflective layer on the patterned insulating layer exposing the light emitting surfaces of the first light emitting pixel associated with the first light emitting diode and the second light emitting pixel associated with the second light emitting diode;

a flat and smooth medium in which organic semiconductors are dispersed within the perimeter of the light emitting surface of the first light emitting pixel associated with the first light emitting diode, wherein the first light emitting diode is configured to emit light of a first primary peak wavelength and wherein the organic semiconductors are configured to receive and convert input light of the first primary peak wavelength from the first light emitting diode to provide output light of a second primary peak wavelength; and a passivation layer on the light emitting diode array, thereby to protect the medium.

13. The light emitting diode array according to claim 12, wherein at least one further light emitting pixel comprises:

a further light emitting diode configured to emit light of the first primary peak wavelength; and further organic semiconductors dispersed in a further medium, wherein the further organic semiconductors are configured to receive and convert input light of the first primary peak wavelength from the further light emitting diode to output light of a third primary peak wavelength.

14. The light emitting diode array according to claim 12, wherein one or more of the light emitting diodes comprises a material covering a light emitting surface of the one or more light emitting diodes, wherein the material is an optically transparent material that enables light emission from the covered one or more light emitting diodes, wherein the one or more light emitting diodes are configured to emit light with the primary peak wavelength.

15. The light emitting diode array according to claim 12, wherein the medium and/or further medium comprises at least one of: a resin, an epoxy and a polymer.

16. The light emitting diode array according to claim 12, wherein the organic semiconductors and/or the further organic semiconductors comprise conjugated organic semiconductors having a plurality of conjugated structures, wherein the organic semiconductors and/or further organic semiconductors are formed from organic semiconductor material, wherein the plurality of conjugated structures comprises a core and an arm, wherein at least two of the plurality of conjugated structures have a different functional property, wherein one functional property is absorption at the first primary peak wavelength and wherein one functional property is emission of absorbed light at the second primary peak wavelength.

17. The light emitting diode array according to claim 12, wherein the light emitting diode array is a high resolution monolithic micro LED array, comprising forming a reflective layer between at least two of the light emitting diodes in the high resolution monolithic micro LED array.

18. The light emitting diode array according to claim 12, wherein the plurality of light emitting pixels each have a light emitting surface that is less than or equal to 100 µm$^2$.

* * * * *